United States Patent
Kung et al.

(10) Patent No.: US 9,324,580 B2
(45) Date of Patent: Apr. 26, 2016

(54) PROCESS FOR FABRICATING A CIRCUIT SUBSTRATE

(71) Applicant: VIA Technologies, Inc., New Taipei (TW)

(72) Inventors: Chen-Yueh Kung, New Taipei (TW); Wen-Yuan Chang, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 14/789,998

(22) Filed: Jul. 2, 2015

(65) Prior Publication Data

US 2015/0303074 A1 Oct. 22, 2015

Related U.S. Application Data

(62) Division of application No. 13/684,578, filed on Nov. 26, 2012.

(30) Foreign Application Priority Data

Sep. 14, 2012 (TW) .............................. 101133850 A

(51) Int. Cl.
*H01L 21/56* (2006.01)
*H01L 21/48* (2006.01)
*H01L 23/48* (2006.01)
*H01L 21/32* (2006.01)
(Continued)

(52) U.S. Cl.
CPC ............ *H01L 21/4857* (2013.01); *H01L 21/32* (2013.01); *H01L 21/486* (2013.01); *H01L 21/6835* (2013.01); *H01L 23/48* (2013.01); *H01L 23/49822* (2013.01); *H01L 24/81* (2013.01); *H05K 1/113* (2013.01); *H05K 3/243* (2013.01); *H05K 3/4007* (2013.01); *H05K 3/423* (2013.01); *H05K 3/429* (2013.01); *H01L 2221/68345* (2013.01); *H01L 2221/68359* (2013.01); *H01L 2221/68381* (2013.01); *H01L 2224/16238* (2013.01); *H01L 2224/8148* (2013.01); *H01L 2224/81385* (2013.01); *H01L 2224/81395* (2013.01); *H01L 2224/81411* (2013.01); *H01L 2224/81418* (2013.01); *H01L 2224/81423* (2013.01); *H01L 2224/81439* (2013.01); *H01L 2224/81444* (2013.01); *H01L 2224/81449* (2013.01);
(Continued)

(58) Field of Classification Search
CPC ................................................... H01L 21/4853
USPC .................................................... 438/622–628
See application file for complete search history.

(56) References Cited

U.S. PATENT DOCUMENTS

2010/0147574 A1* 6/2010 Kaneko ............... H01L 21/4853
174/261

*Primary Examiner* — Cuong Q Nguyen
(74) *Attorney, Agent, or Firm* — Jianq Chyun IP Office

(57) ABSTRACT

A process for fabricating a circuit substrate is provided. The process includes the following steps. A carrier is provided. A conductive layer and a dielectric layer are placed on the carrier, and the conductive layer is located between the carrier and the dielectric layer. The dielectric layer is patterned to form a patterned-dielectric layer having first openings partially exposing the conductive layer. Arc-shaped grooves are formed on the exposed part of the conductive layer. A first-patterned-photoresist layer having second openings respectively connecting the first openings is formed. Conductive structures are formed, wherein each of the conductive structures is integrally formed and includes a pad part, a connection part, and a protruding part; the second openings, the first openings and the arc-shaped grooves are respectively filled with the pad parts, the connection parts and the protruding parts. The first patterned photoresist layer, the carrier and the conductive layer are removed.

8 Claims, 10 Drawing Sheets

(51) Int. Cl.
*H01L 21/683* (2006.01)
*H01L 23/00* (2006.01)
*H01L 23/498* (2006.01)
*H05K 1/11* (2006.01)
*H05K 3/24* (2006.01)
*H05K 3/40* (2006.01)
*H05K 3/42* (2006.01)
*H05K 3/46* (2006.01)

(52) U.S. Cl.
CPC ............... *H01L 2224/81455* (2013.01); *H01L 2224/81464* (2013.01); *H01L 2224/81469* (2013.01); *H01L 2924/12042* (2013.01); *H01L 2924/381* (2013.01); *H05K 3/4682* (2013.01); *H05K 2201/096* (2013.01); *H05K 2201/09518* (2013.01); *H05K 2201/09563* (2013.01); *H05K 2203/016* (2013.01); *H05K 2203/1461* (2013.01)

PROCESS FOR FABRICATING A CIRCUIT SUBSTRATE

CROSS-REFERENCE TO RELATED APPLICATION

This application is a divisional application of U.S. application Ser. No. 13/684,578, filed on Nov. 26, 2012, which claims the priority benefit of Taiwan patent application serial no. 101133850, filed on Sep. 14, 2012. The entirety of each of the above-mentioned patent applications is hereby incorporated by reference herein and made a part of this specification.

BACKGROUND OF THE INVENTION

1. Field of the Invention

The invention relates to a circuit substrate and a process for fabricating the same. More particularly, the invention relates to a circuit substrate that may be applied in a semiconductor package and a process for fabricating the circuit substrate.

2. Description of Related Art

In accordance with the existing semiconductor packaging technology, chip carriers are commonly used for the interconnection between integrated circuit (IC) chips and the next-level electronic devices, such as motherboards, module boards, or the like. A circuit substrate is often employed in the chip carrier with high I/O count. A conventional circuit substrate is mainly composed of a plurality of patterned conductive layers and a plurality of dielectric layers alternately stacked to one another. In addition, the patterned conductive layers are electrically connected through a plurality of conductive vias.

A flip-chip bonding process is a packaging process applicable to the IC chip with high I/O count; by performing the flip-chip bonding process, the IC chip may be connected to the circuit substrate through a plurality of conductive structures arranged as an area array. However, in a process for fabricating the conductive structures, openings of a patterned photoresist layer are required to communicate with and completely expose openings of a dielectric layer. Hence, when the openings of the patterned photoresist layer are formed, the requirement for alignment accuracy poses a limitation on formation of the openings of the patterned photoresist layer, and thereby a width of the openings of the patterned photoresist layer need be greater than a width of the openings of the dielectric layer or a solder resist layer. As such, the size of the openings of the patterned photoresist layer cannot be reduced, and nor can the dimensions and bump pitches of conductive bumps. Moreover, since the bump pitches are unlikely to be shortened, pitches among chip pads on the chips cannot be correspondingly shortened.

SUMMARY OF THE INVENTION

The invention is directed to a circuit substrate in which pitches among conductive structures for electrical connection are relatively short.

The invention is directed to a process for fabricating a circuit substrate. By applying the process, pitches among conductive structures of the circuit substrate for electrical connection are relatively short.

In an embodiment of the invention, a circuit substrate includes a first dielectric layer, a plurality of conductive structures, a second dielectric layer, and a plurality of conductive pillars. The first dielectric layer includes a plurality of first conductive openings, a first surface, and a second surface opposite to the first surface. Each of the first conductive openings connects the first surface and the second surface. The first conductive openings are respectively filled with the conductive structures, and each of the conductive structures is integrally formed and includes a pad part, a connection part, and a protruding part. Each of the connection parts is connected to the corresponding pad part and the corresponding protruding part. Each of the protruding parts has a curved surface that protrudes from the second surface. The second dielectric layer is disposed on the first surface of the first dielectric layer. The pad parts are respectively located in the second dielectric layer. Here, the second dielectric layer includes a plurality of second conductive openings respectively connecting the pad parts. The conductive pillars are connected to the pad parts, and the second conductive openings are respectively filled with the conductive pillars. Each of the conductive pillars includes a connection pad that protrudes from a third surface of the second dielectric layer, and the third surface is opposite to the first surface.

In an embodiment of the invention, a circuit substrate that includes a dielectric layer and a plurality of conductive structures is provided. The dielectric layer has a plurality of conductive openings, a first surface, and a second surface opposite to the first surface. Each of the conductive openings connects the first surface and the second surface. The conductive openings are respectively filled with the conductive structures. Each of the conductive structures is integrally formed and includes a pad part, a connection part, and a protruding part. Each of the connection parts is connected to the corresponding pad part and the corresponding protruding part. Each of the protruding parts has a curved surface that protrudes from the second surface.

In an embodiment of the invention, a process for fabricating a circuit substrate includes following steps. A carrier is provided. A conductive layer and a dielectric layer are placed on the carrier, and the conductive layer is located between the carrier and the dielectric layer. The dielectric layer is patterned to form a patterned dielectric layer. Here, the patterned dielectric layer has a plurality of first openings respectively exposing a portion of the conductive layer. A plurality of arc-shaped grooves are formed on the conductive layer with use of the patterned dielectric layer as a mask. A first patterned photoresist layer is formed. The first patterned photoresist layer has a plurality of second openings respectively connecting the first openings. A plurality of conductive structures are formed with use of the first patterned photoresist layer as a mask. Here, each of the conductive structures is integrally formed and includes a pad part, a connection part, and a protruding part. The second openings are respectively filled with the pad parts. The first openings are respectively filled with the connection parts. The arc-shaped grooves are respectively filled with the protruding parts. The first patterned photoresist layer and the carrier are removed. The conductive layer is removed to expose the protruding parts.

In view of the above, the design of the curved surfaces of the protruding parts in the conductive structures is conducive to an increase in the bonding area of the protruding parts. Hence, according to an embodiment of the invention, it is not necessary to increase the width of the protruding parts. Besides, the conductive structures described herein are integrally formed and are not subject to the alignment accuracy requirement, and the pitches among the conductive structures of the circuit substrate described herein may be effectively reduced.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
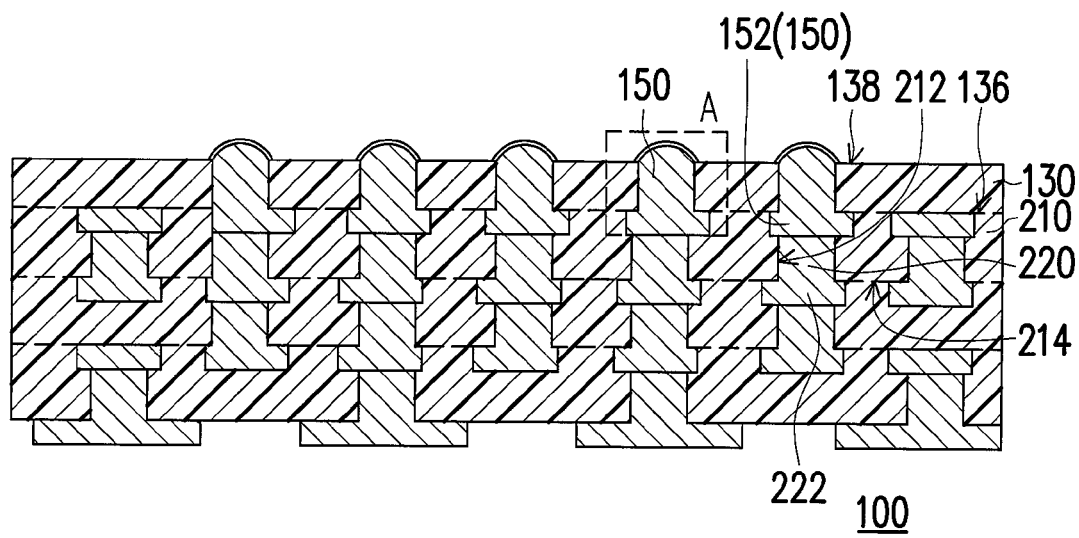
FIG. 1A is a schematic cross-sectional view illustrating a circuit substrate according to an embodiment of the invention.
Figure 1B:
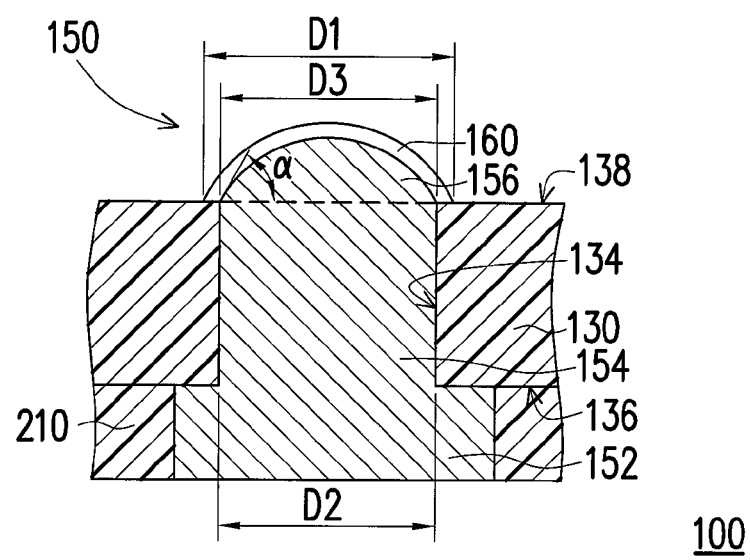
FIG. 1B is a schematic partial enlarged view illustrating an area A depicted in FIG. 1A.

FIG. 1A is a schematic cross-sectional view illustrating a circuit substrate according to an embodiment of the invention. FIG. 1B is a partial enlarged view illustrating an area A depicted in FIG. 1A. In FIG. 1B, one of the conductive structures 150 in the first dielectric layer 130 is partially enlarged for detailed illustration and description. With reference to FIG. 1A and FIG. 1B, the circuit substrate 100 in the present embodiment includes a first dielectric layer 130, a plurality of conductive structures 150, a second dielectric layer 210, and a plurality of conductive pillars 220. The first dielectric layer 130 has a plurality of first conductive openings 134 (one of which is shown in FIG. 1B), a first surface 136, and a second surface 138 opposite to the first surface 136. In the present embodiment, a thickness of the first dielectric layer 130 ranges from 5 μm to 30 μm; however, the invention is not limited thereto, and the thickness of the first dielectric layer 130 may be determined by designers based on actual requirements. Each of the first conductive openings 134 connects the first surface 136 and the second surface 138. The first conductive openings 134 are respectively filled with the conductive structures 150. Each of the conductive structures 150 is integrally formed and includes a pad part 152, a connection part 154, and a protruding part 156. Each of the connection parts 154 is connected to the corresponding pad part 152 and the corresponding protruding part 156. Each of the protruding parts 156 has a curved surface protruding from the second surface 138, and each of the pad parts 152 respectively protrudes from the first surface 136.

As described above, the second dielectric layer 210 is disposed on the first surface 136 of the first dielectric layer 130. The pad parts 152 protrude from the first surface 136 and are respectively located in the second dielectric layer 210. Here, the second dielectric layer 210 includes a plurality of second conductive openings 212 respectively connecting the pad parts 152. The conductive pillars 220 are connected to the pad parts 152, and the second conductive openings 212 are respectively filled with the conductive pillars 220. Each of the conductive pillars 220 includes a connection pad 222 that protrudes from a third surface 214 of the second dielectric layer 210, and the third surface 214 is opposite to the first surface 136. According to the present embodiment, the circuit substrate 100 further includes a plurality of metal barrier layers 160 respectively covering the protruding parts 156. A material of the metal barrier layers 160 may be tin, palladium, gold, nickel, platinum, silver, magnesium, zinc, manganese, molybdenum, any other suitable metal material, or a combination thereof. In particular, an included angle α between a tangent of each of the protruding parts 156 and a horizontal line is smaller than or equal to 45°. Besides, a protruding section of each of the protruding parts 156 and the corresponding metal barrier layer 160 from the second surface 138 has a diameter D1, a diameter of each of the connection parts 154 is D2, and |D1−D2|/2≤5 μm.

In the present embodiment, as shown in FIG. 1B, a protruding section of each of the protruding parts 156 from the second surface 138 has a diameter D3 which is approximately equal to the diameter D2 of each connection part 154. Hence, the protruding section of each of the protruding parts 156 and the corresponding metal barrier layer 160 from the second surface 138 has the diameter D1 which is greater than the diameter D2 of each connection part 154.

Figure 2A:
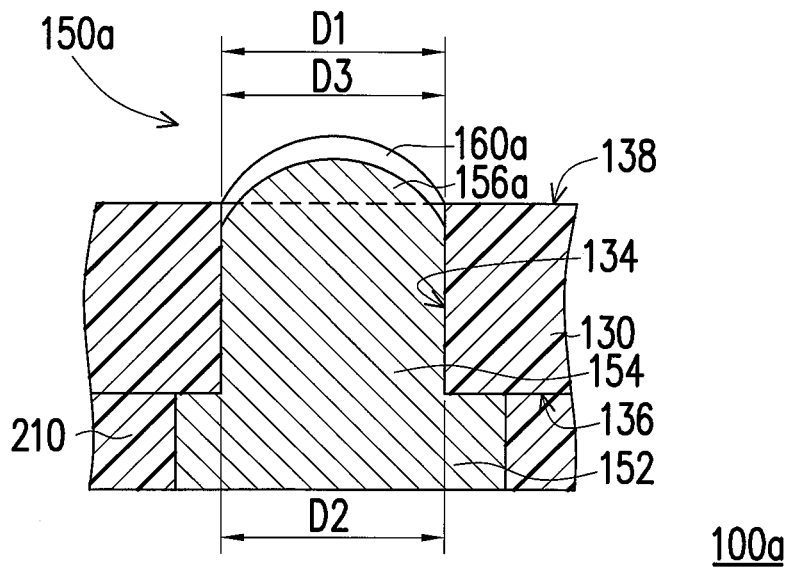
FIG. 2A is a schematic cross-sectional view illustrating a conductive structure according to another embodiment of the invention.

FIG. 2A is a schematic cross-sectional view illustrating a conductive structure according to another embodiment of the invention. The conductive structure 150a described in the present embodiment is similar to the conductive structure 150 described above, whereas a protruding section of each of the protruding parts 156a and the corresponding metal barrier layer 160a from the second surface 138 has the diameter D1 that is substantially equal to the diameter D2 of the corresponding connection part 154. Namely, the protruding section of each of the protruding parts 156a from the second surface 138 has the diameter D3 which is smaller than the diameter D2 of each connection part 154.

Figure 2B:
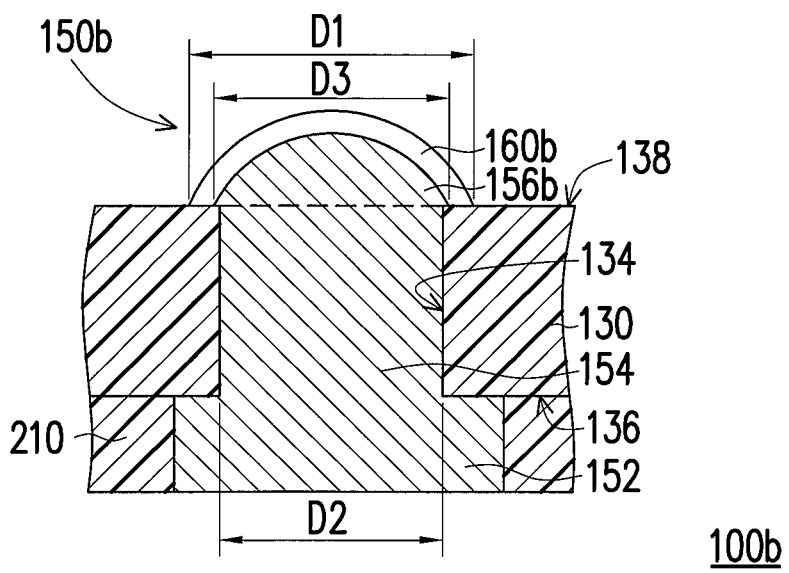
FIG. 2B is a schematic cross-sectional view illustrating a conductive structure according to another embodiment of the invention.

FIG. 2B is a schematic cross-sectional view illustrating a conductive structure according to another embodiment of the invention. The conductive structure 150b described in the present embodiment is similar to the conductive structure 150 described above, whereas the protruding section of each of the protruding parts 156b from the second surface 138 has the diameter D3 that is greater than the diameter D2 of the corresponding connection part 154. That is, the protruding parts 156b cover a portion of the second surface 138. Besides, the protruding section of each of the protruding parts 156b and the corresponding metal barrier layer 160b from the second surface 138 has the diameter D1 that is greater than the diameter D2 of the corresponding connection part 154.

Since the design of the curved surfaces of the protruding parts in the conductive structures is conducive to an increase in the bonding area of the protruding parts, it is not necessary to increase the width of the protruding parts. In addition, the conductive structures described herein are integrally formed and are not subject to the alignment accuracy requirement. Hence, pitches among the conductive structures may be effectively reduced.

Figure 3A:
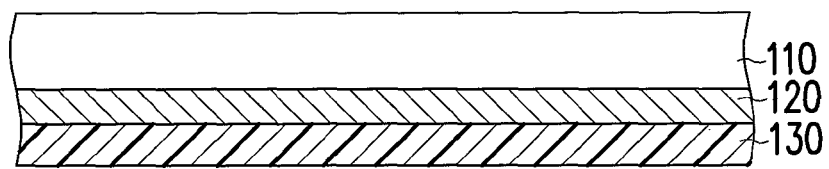
FIG. 3A to FIG. 3O are schematic cross-sectional views illustrating a process for fabricating a circuit substrate according to an embodiment of the invention.
Figure 3B:
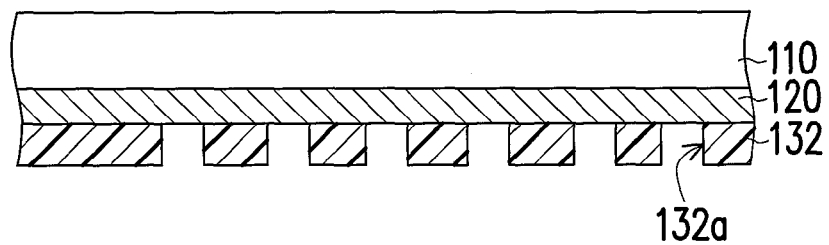
Figure 3C:
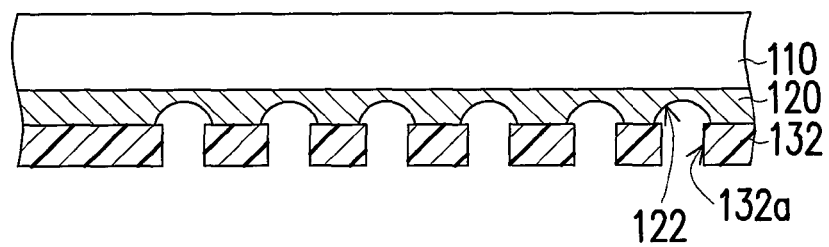
Figure 3D:
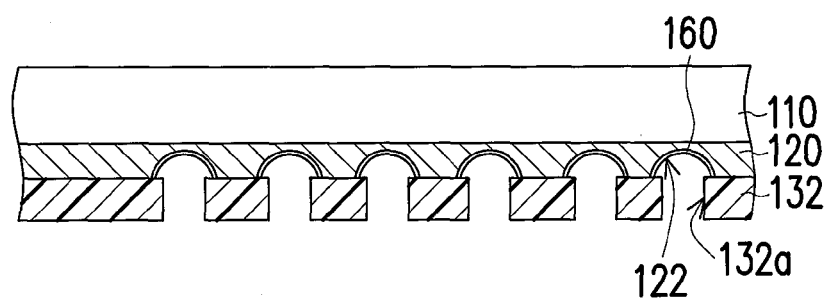
Figure 3E:
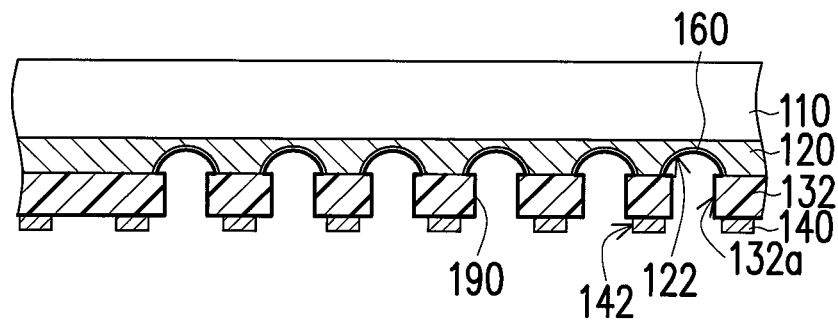
Figure 3F:
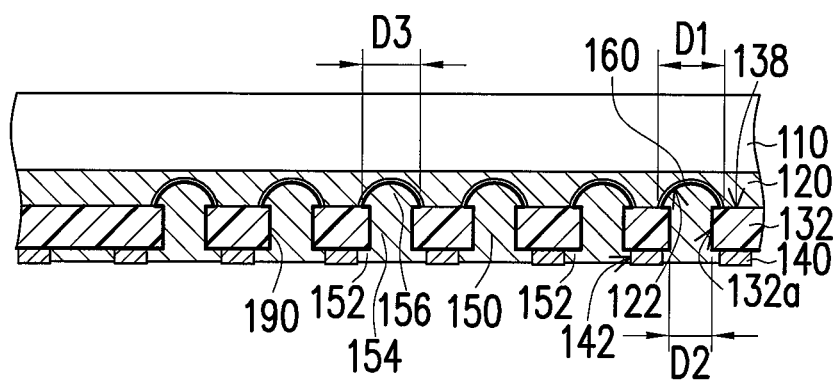
Figure 3G:
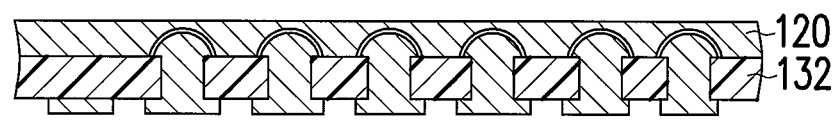
Figure 3H:
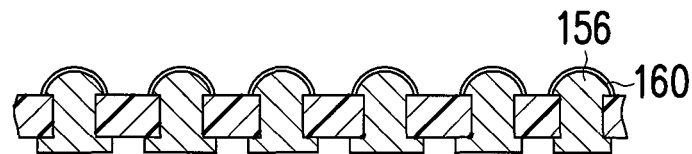
Figure 3I:
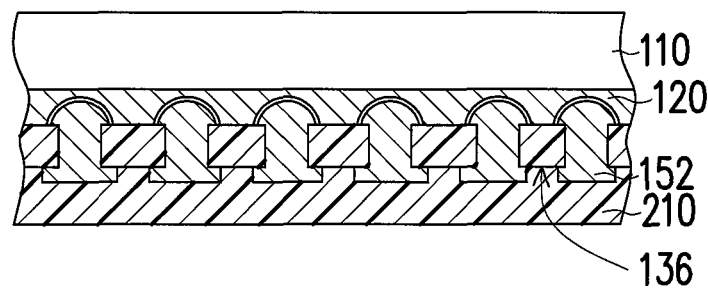
Figure 3J:
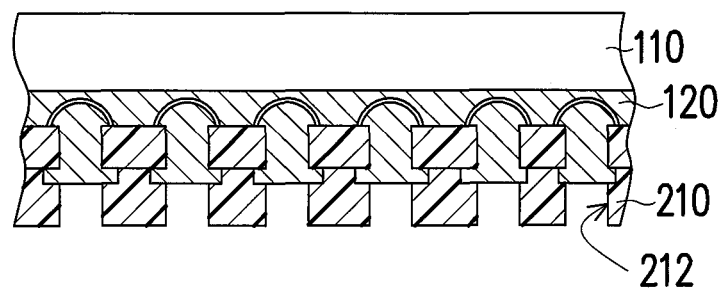
Figure 3K:
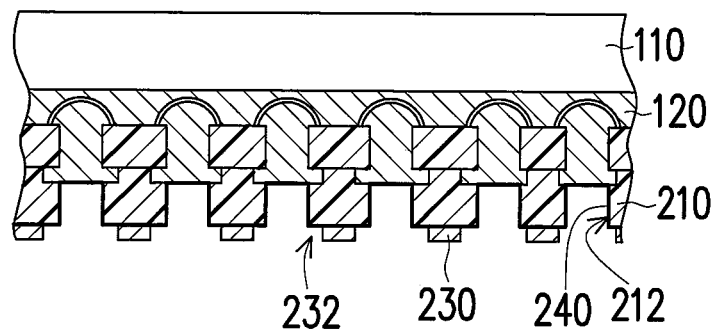
Figure 3L:
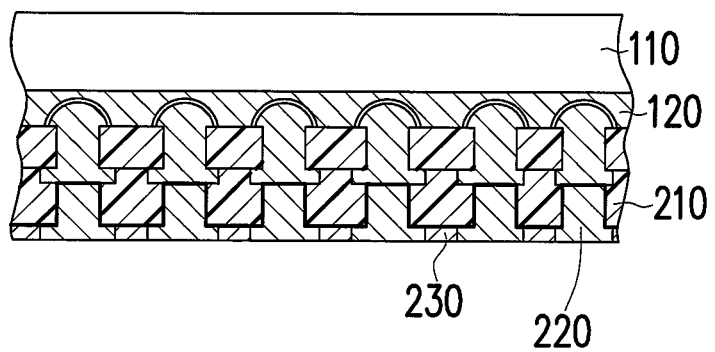
Figure 3M:
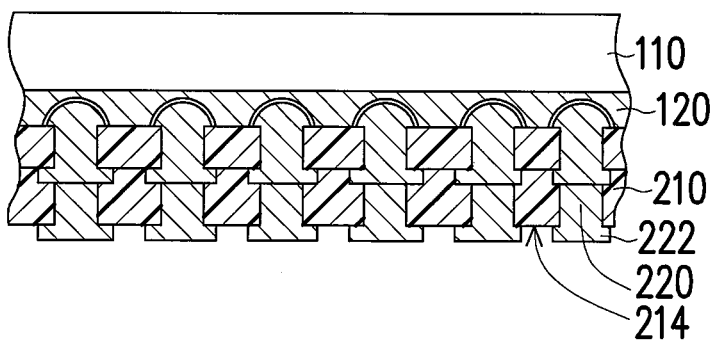
Figure 3N:
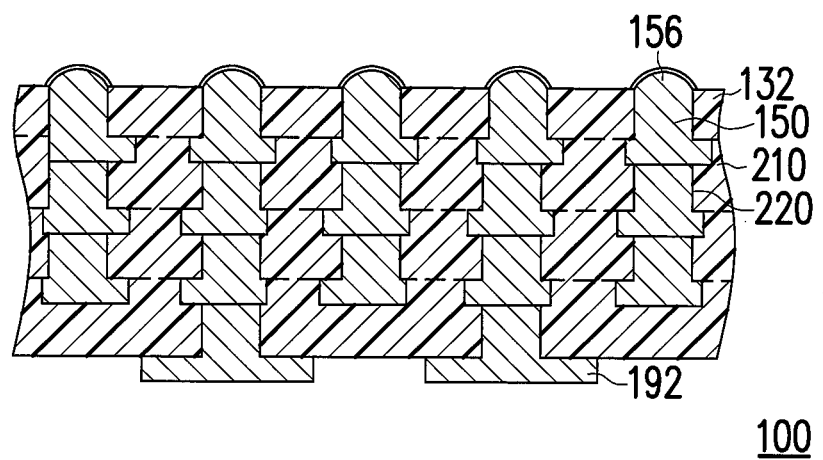
Figure 3O:
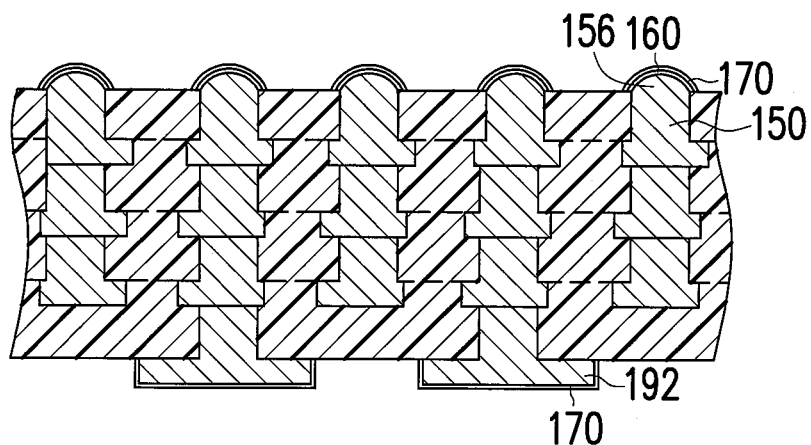

FIG. 3A to FIG. 3O are schematic cross-sectional views illustrating a process for fabricating a circuit substrate according to an embodiment of the invention. In order to make the circuit substrates 100, 100a and 100b described in the previous embodiments, a process for fabricating a circuit substrate is provided herein, and steps included in said process are elaborated below. With reference to FIG. 3A, a carrier 110 is provided, and a conductive layer 120 and a first dielectric layer 130 are placed on the carrier 110. Here, the conductive layer 120 is located between the carrier 110 and the first dielectric layer 130. According to the present embodiment, the carrier 110 is made of a glass plate or a ceramic plate, for instance. The carrier 110 and the conductive layer 120 may be adhered to each other with use of an adhesive. The conductive layer 120 is made of copper, for instance. With reference to FIG. 3B, the first dielectric layer 130 is patterned to form a first patterned dielectric layer 132. The first patterned dielectric layer 132 has a plurality of first openings 132a. The first openings 132a respectively expose a portion of the conductive layer 120. In the present embodiment, a method of forming the first patterned dielectric layer 132 includes laser drilling, which should not be construed as a limitation to the invention, i.e., the first patterned dielectric layer 132 is likely to be made by performing an anisotropic etching process, e.g., wet or dry etching when the first dielectric layer 130 is photo-dielectric type, photo lithography also could be applied. With reference to FIG. 3C, a plurality of arc-shaped grooves 122 are formed on the conductive layer 120 with use of the first patterned dielectric layer 132 as a mask. In the present embodiment, a method of forming the arc-shaped grooves 122 on the conductive layer 120 includes wet etching, which should not be construed as a limitation to the invention, e.g., the first patterned dielectric layer 132 may be made by performing an anisotropic etching process other than wet etching.

With reference to FIG. 3D, a metal barrier layer 160 is formed on a surface of each of the arc-shaped grooves 122. A material of the metal barrier layers 160 may be tin, palladium, gold, nickel, platinum, silver, magnesium, zinc, manganese, molybdenum, any other suitable metal material, or a combination thereof. With reference to FIG. 3E, a first patterned photoresist layer 140 is formed. The first patterned photoresist layer 140 has a plurality of second openings 142 respectively connecting the first openings 132a. In the present embodiment, a diameter of each second opening 142 is greater than a diameter of each first opening 132a, which should however not be construed as a limitation to the invention. According to another embodiment, the diameter of the second opening 142 may be substantially equal to the diameter of the first opening 132a. With reference to FIG. 3F, a plurality of conductive structures 150 are formed with use of the first patterned photoresist layer 140 as a mask. In an embodiment of the invention, a method of forming the conductive structures 150 includes forming a first seed layer 190 (shown in FIG. 3E) on the first patterned dielectric layer 132 and the surfaces of the arc-shaped grooves 122 before forming the first patterned photoresist layer 140 shown in FIG. 3E. Then the first patterned photoresist layer 140 is formed, and an electroplating process is performed through the first seed layer 190, so as to form the conductive structures 150. According to the present embodiment, the conductive structures 150 are made of copper, for instance.

As shown in FIG. 3F, each of the conductive structures 150 formed by performing the electroplating process is integrally formed and includes a pad part 152, a connection part 154, and a protruding part 156. The second openings 142 are respectively filled with the pad parts 152. The first openings 132a are respectively filled with the connection parts 154. The arc-shaped grooves 122 are respectively filled with the protruding parts 156. A protruding section of each of the protruding parts 156 of the conductive structures 150 and the corresponding metal barrier layer 160 from the second surface 138 has a diameter D1, a diameter of each of the connection parts 154 is D2, and |D1−D2|/2≤5 μm. Additionally, an included angle α between a tangent of each of the protruding parts 156 and a horizontal line is smaller than or equal to 45°.

Note that the protruding section of each of the protruding parts 156 from the second surface 138 shown in FIG. 3F has the diameter D3 which is greater than the diameter D2 of each connection part 154. That is, the protruding parts 156 cover a portion of the second surface 138, and the protruding section of each of the protruding parts 156 and the corresponding metal barrier layer 160 from the second surface 138 has the diameter D1 that is greater than the diameter D2 of the corresponding connection part 154. However, the invention is not limited thereto, and the protruding section of each of the protruding parts 156 from the second surface 138 shown in FIG. 1B may have the diameter D3 approximately equal to the diameter D2 of each connection part 154. Hence, the protruding section of each of the protruding parts 156 and the corresponding metal barrier layer 160 has the diameter D1 that is greater than the diameter D2 of each connection part 154. Alternatively, the protruding section of each of the protruding parts 156a from the second surface 138 shown in FIG. 2A and the corresponding metal barrier layer 160a may have the diameter D1 that is substantially equal to the diameter D2 of the corresponding connection part 154. Accordingly, the protruding section of each of the protruding parts 156a from the second surface 138 has the diameter D3 which is smaller than the diameter D2 of each connection part 154. In other words, the diameter D3 of the protruding section of each of the protruding parts 156 from the second surface 138, as described in the previous embodiment, is determined by the thickness of the metal barrier layer 160. The smaller the thickness of the metal barrier layer 160, the greater the diameter of the protruding section of each of the protruding parts 156 from the second surface 138.

With reference to FIG. 3G and FIG. 3H, the first patterned photoresist layer 140 and the carrier 110 depicted in FIG. 3F are removed. In an embodiment of the invention, the adhesive between the carrier 110 and the conductive layer 120 may be removed by solvent. The conductive layer 120 is removed to expose the protruding parts 156. So far, the circuit substrate with one layer of circuits is completely formed, and the one-layer of circuits herein refers to one or more pad parts 152 arranged in a one-layer manner.

If a circuit substrate with multiple circuit layers is to be formed, steps shown in FIG. 3I are performed after the steps shown in FIG. 3F are implemented, i.e., a second dielectric layer 210 is formed on the first surface 136 and covers the first surface 136 and the pad parts 152. With reference to FIG. 3J, the second dielectric layer 210 is patterned, such that the second dielectric layer 210 is equipped with a plurality of second conductive openings 212. The second conductive openings 212 respectively expose a portion of the pad parts 152. In the present embodiment, a method of forming the second conductive openings 212 includes laser drilling, which should not be construed as a limitation to the invention, and the second conductive openings 212 may be made by performing an anisotropic etching process, e.g., wet or dry etching.

With reference to FIG. 3K, a third patterned photoresist layer 230 is formed. The third patterned photoresist layer 230 has a plurality of third openings 232 respectively connecting the second conductive openings 212. In the present embodiment, a diameter of each third opening 232 is greater than a diameter of each second conductive opening 212, which should however not be construed as a limitation to the invention. According to another embodiment, the diameter of the third opening 232 may be substantially equal to the diameter of the second conductive opening 212. With reference to FIG. 3L, a plurality of conductive pillars 220 are formed with use of the third patterned photoresist layer 230 as a mask. In an embodiment of the invention, a method of forming the conductive pillars 220 includes forming a second seed layer 240 (shown in FIG. 3K) on the second dielectric layer 210 and the exposed pat parts 152 before forming the third patterned photoresist layer 230 shown in FIG. 3K. Then, the third patterned photoresist layer 230 is formed, and an electroplating process is performed through the second seed layer 240, so as to form the conductive pillars 220. According to the present embodiment, the conductive pillars 220 are made of copper, for instance. With reference to FIG. 3M, the third patterned photoresist layer 230 shown in FIG. 3L is removed, such that the connection pads 222 of the conductive pillars 220 protrude from a third surface 214 of the second dielectric layer 210.

The steps shown in FIG. 3I to FIG. 3M are repetitively performed to obtain the required circuit layers; thereafter, the carrier 110 is removed, and the conductive layer 120 is removed to expose the protruding parts 156; thereby, the circuit substrate 100 with multiple circuit layers as shown in FIG. 3N may be completely formed. In the circuit substrate 100, it should be mentioned that the conductive structures 150 for connecting chips are first formed, and the process for fabricating the circuit substrate 100 is completed after the external pads 192 for connecting a circuit board are formed, so as to connect solder balls. Hence, in comparison with the density of the protruding parts 156 of the conductive structures 150 on the circuit substrate 100, the density of the external pads 192 (connected to the circuit board) of the circuit substrate 100 is relatively low. In the present embodiment, as shown in FIG. 3O, a passivation layer 170 may be formed on surfaces of the protruding parts 156 and the external pads 192, so as to cover the protruding parts 156 and the external pads 192. The passivation layer 170 may be an organic surface passivation (OSP) layer and may be made of nickel, palladium, gold, any other suitable material, or a combination thereof. Since the passivation layer 170 may isolate the surfaces of the protruding parts 156 from external air, the surfaces of the protruding parts 156 are less likely to be oxidized.

The conventional conductive structures are formed at different stages; by contrast, the conductive structures 150 described in the present embodiment are integrally formed by performing an electroplating process and thus are not subject to the requirement for alignment accuracy. In addition, the design of the curved surfaces of the protruding parts 156 in the conductive structures 150 is conducive to an increase in the bonding area of the protruding parts 156, while it is not necessary to increase the width of the protruding parts 156. Hence, in the process for fabricating the circuit substrate described in the present embodiment, the pitches among the conductive structures 150 may be shortened. Moreover, according to the conventional process, an end portion where the circuit substrate is connected to the circuit board is first formed layer by layer, and end portions where the circuit substrate is bonded to chips are formed at last. Alternatively, the core layer of the circuit substrate is laminated in an outward manner, so as to form a circuit layer. If there are a number of circuit layers in the circuit substrate, the pitches among the conductive structures at the end portions where the circuit substrate is bonded to the chips may not be effectively shortened due to the limitation of alignment accuracy. In the present embodiment, the conductive structures 150 where the circuit substrate is bonded to the chips are first formed, and multiple circuit layers of the circuit substrate are subsequently fabricated; hence, the pitches among the conductive structures 150 may be limited within a certain range, and the issue of alignment error tolerance need not be taken into account.

Figure 4A:
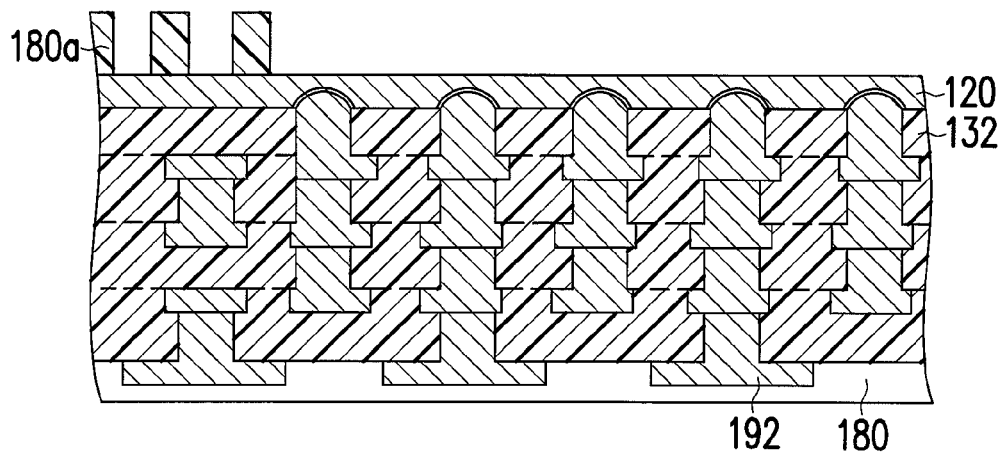
FIG. 4A to FIG. 4C are schematic cross-sectional views illustrating several steps in a process for fabricating a circuit substrate according to an embodiment of the invention.
Figure 4B:
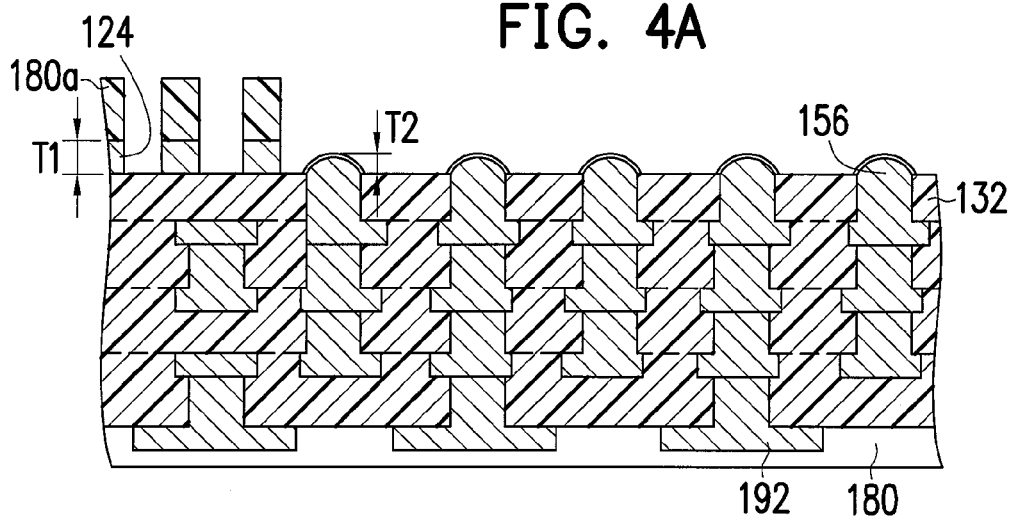
Figure 4C:
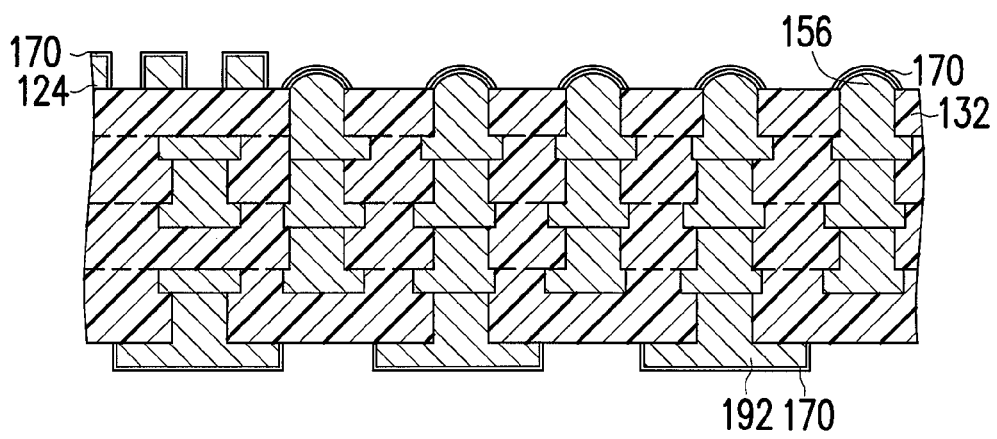

FIG. 4A to FIG. 4C are schematic cross-sectional views illustrating several steps in a process for fabricating a circuit substrate according to an embodiment of the invention. Reference numbers and some descriptions provided in the previous embodiment are also applied in the present embodiment. The same reference numbers represent the same or similar components in this and the previous embodiments, and repetitive descriptions are omitted. The omitted descriptions may be referred to as those described in the previous embodiments.

The process for fabricating the circuit substrate 200 with multiple circuit layers as described in the present embodiment is similar to the process for fabricating the circuit substrate 100 described in the previous embodiment. After the steps shown in FIG. 3G are performed, a second patterned photoresist layer 180a is formed on the conductive layer 120 and the first patterned dielectric layer 132, and an anti-etching layer 180 is formed on the external pads 192 to cover surfaces of the external pads 192 as shown in FIG. 4A. As shown in FIG. 4B, the conductive layer 120 is removed with use of the second patterned photoresist layer 180a as a mask, so as to form at least one conductive pattern 124 on the first patterned dielectric layer 132 and expose the protruding parts 156 each having the corresponding metal barrier layer. In FIG. 4B, three conductive patterns 124 are shown. As shown in FIG. 4B, a thickness T1 of the conductive pattern 124 exceeds the maximum thickness T2 of each protruding part 156. In the present embodiment, the conductive pattern 124 may serve to strengthen the structure of the circuit substrate 200 and also enhance heat-conducting efficiency. The anti-etching layer 180 is removed to expose the external pads 192. As shown in FIG. 4C, a passivation layer 170 is formed on the conductive patterns 124, the protruding parts 156, and the external pads 192, so as to cover the conductive patterns 124, the protruding parts 156, and the external pads 192. Since the passivation layer 170 may isolate the surfaces of the protruding parts 156 from external air, the surfaces of the protruding parts 156 are less likely to be oxidized.

Figure 5A:
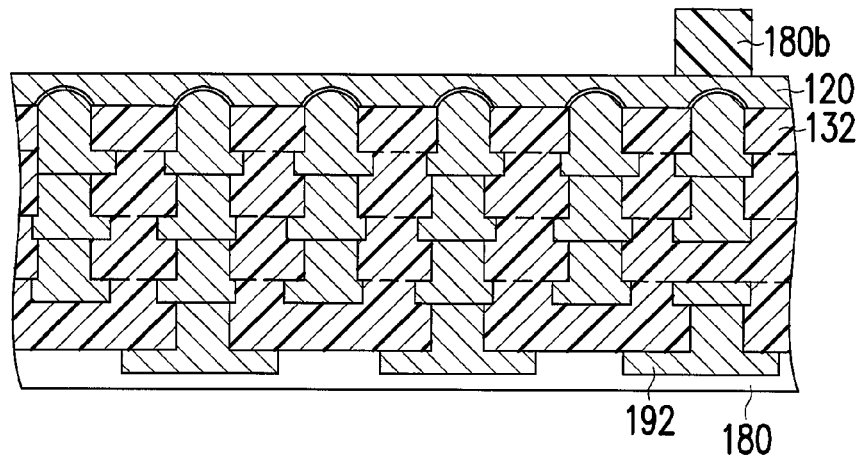
FIG. 5A to FIG. 5C are schematic cross-sectional views illustrating several steps in a process for fabricating a circuit substrate according to an embodiment of the invention.
Figure 5B:
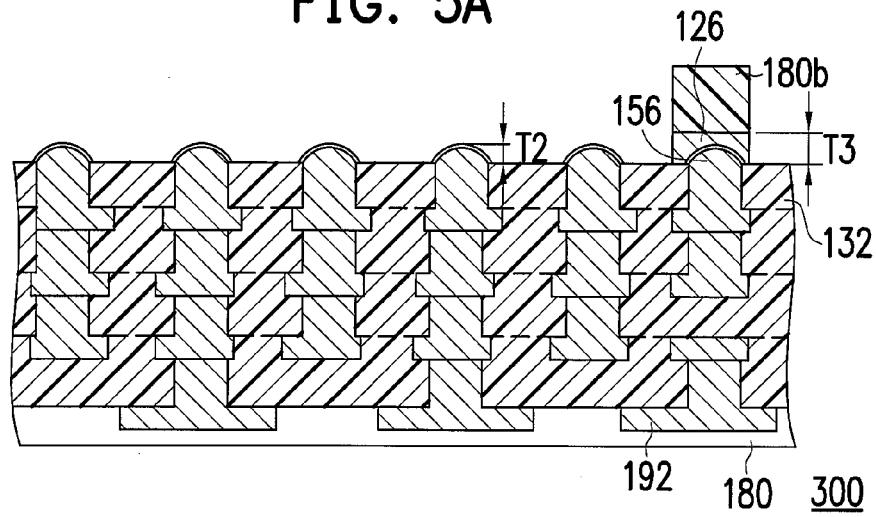
Figure 5C:
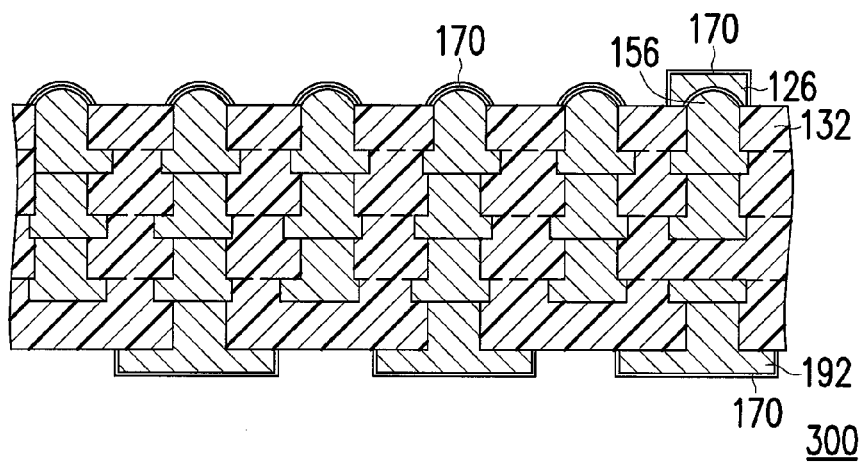

FIG. 5A to FIG. 5C are schematic cross-sectional views illustrating several steps in a process for fabricating a circuit substrate according to an embodiment of the invention. Reference numbers and some descriptions provided in the previous embodiment are also applied in the present embodiment. The same reference numbers represent the same or similar components in this and the previous embodiments, and repetitive descriptions are omitted. The omitted descriptions may be referred to as those described in the previous embodiments.

The process for fabricating the circuit substrate 300 with multiple circuit layers as described in the present embodiment is similar to the process for fabricating the circuit substrate 100 described in the previous embodiment. After the steps shown in FIG. 3G are performed, a second patterned photoresist layer 180b is formed on the conductive layer 120 and the first patterned dielectric layer 132, and an anti-etching layer 180 is formed on the external pads 192 to cover surfaces of the external pads 192 as shown in FIG. 5A. As shown in FIG. 5B, the conductive layer 120 is removed with use of the second patterned photoresist layer 180b as a mask, so as to form at least one electrical pad 126 on at least one of the protruding parts 156. In FIG. 5B, one electrical pad 126 is shown. The electrical pad 126 covers the corresponding protruding part 156, and the other protruding parts 156 having the metal barrier layers are not covered by the first patterned dielectric layer 132. As shown in FIG. 5B, a thickness T3 of the electrical pad 126 exceeds the maximum thickness T2 of the corresponding protruding part 156. According to the present embodiment, the electrical pad 126 may serve as a circuit contact on the circuit substrate 200. The anti-etching layer 180 is removed to expose the external pads 192. As shown in FIG. 5C, a passivation layer 170 is formed on the electrical pad 126, the protruding parts 156, and the external pads 192, so as to cover the electrical pad 126, the protruding parts 156, and the external pads 192.

Figure 6:
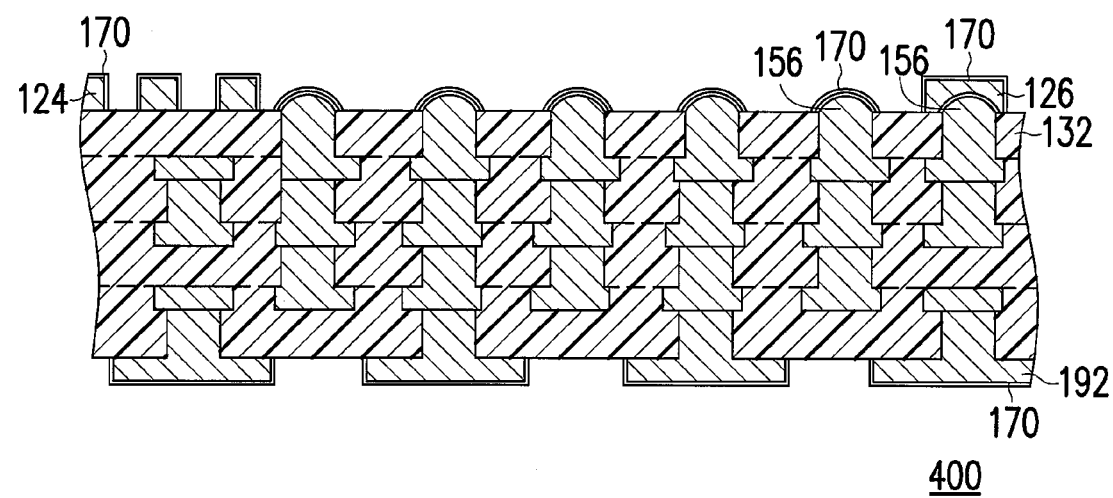
FIG. 6 is a schematic cross-sectional view illustrating a circuit substrate according to an embodiment of the invention.

FIG. 6 is a schematic cross-sectional view illustrating a circuit substrate with multiple circuit layers according to an embodiment of the invention. With reference to FIG. 6, the conductive patterns 124 and the electrical pad 126 may be simultaneously formed on the first patterned dielectric layer 132 after the steps depicted in FIG. 3G are carried out, i.e., after removing the first patterned photoresist layer 140 and the carrier 110 shown in FIG. 3F are removed. As shown in FIG. 6, the circuit substrate 400 includes the conductive patterns 124 for heat dissipation, the electrical pad 126 acting as a circuit contact, and the conductive structures 150.

To sum up, the design of the curved surfaces of the protruding parts in the conductive structures is conducive to an increase in the bonding area of the protruding parts, while it is not necessary to increase the width of the protruding parts. In addition, the conductive structures described herein are integrally formed and are not subject to the requirement for alignment accuracy. Hence, pitches among the conductive structures may be effectively reduced. Moreover, according to the conventional process, an end portion where the circuit substrate is connected to the circuit board is first formed layer by layer, and the end portions where the circuit substrate is bonded to the chips are formed at last. Alternatively, the core layer of the circuit substrate is laminated in an outward manner, so as to form a circuit layer. In said fabricating process, if there are a number of circuit layers in the circuit substrate, the pitches among the conductive structures at the end portions where the circuit substrate is bonded to the chips may not be effectively shortened due to the limitation of alignment accuracy. In an embodiment of the invention, the conductive structures where the circuit substrate is bonded to the chips are first formed, and multiple circuit layers of the circuit substrate are subsequently fabricated; hence, the pitches among the conductive structures may be limited within a required range, alignment errors may be reduced, and manufacturing accuracy may be achieved. As such, the pitches among the conductive structures in the circuit board are indeed shortened effectively.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A process for fabricating a circuit substrate, the process comprising:
providing a carrier;
placing a conductive layer and a dielectric layer on the carrier, the conductive layer being located between the carrier and the dielectric layer;
patterning the dielectric layer to form a patterned dielectric layer, the patterned dielectric layer having a plurality of first openings respectively exposing a portion of the conductive layer;
forming a plurality of arc-shaped grooves on the conductive layer with use of the patterned dielectric layer as a mask;
forming a first patterned photoresist layer, wherein the first patterned photoresist layer has a plurality of second openings respectively connecting the first openings;
forming a plurality of conductive structures with use of the first patterned photoresist layer as a mask, wherein each of the conductive structures is integrally formed and comprises a pad part, a connection part, and a protruding part, the second openings are respectively filled with the pad parts, the first openings are respectively filled with the connection parts, and the arc-shaped grooves are respectively filled with the protruding parts;
removing the first patterned photoresist layer and the carrier; and
removing the conductive layer to expose the protruding parts.

2. The process as recited in claim 1, further comprising:
forming a metal barrier layer on a surface of each of the arc-shaped grooves after forming the arc-shaped grooves on the conductive layer.

3. The process as recited in claim 1, wherein a method of forming the arc-shaped grooves on the conductive layer comprises wet etching.

4. The process as recited in claim 1, wherein the step of forming the conductive structures with use of the first patterned photoresist layer as the mask comprises:
forming a seed layer on the patterned dielectric layer and surfaces of the arc-shaped grooves;
forming the first patterned photoresist layer; and
performing an electroplating process through the seed layer to form the conductive structures.

5. The process as recited in claim 1, further comprising:
forming a second patterned photoresist layer on the conductive layer; and
removing the conductive layer with use of the second patterned photoresist layer as a mask, so as to form at least one conductive pattern on the patterned dielectric layer and expose the protruding parts.

6. The process as recited in claim 5, wherein a thickness of the at least one conductive pattern is greater than a maximum thickness of the protruding parts.

7. The process as recited in claim 1, further comprising:
forming a second patterned photoresist layer on the conductive layer; and
removing the conductive layer with use of the second patterned photoresist layer as a mask, so as to form at least one electrical pad on at least one of the protruding parts, wherein the at least one electric pad covers a corresponding protruding part of the protruding parts, and the other protruding parts are not covered by the patterned dielectric layer.

8. The process as recited in claim 7, wherein a thickness of the at least one electrical pad is greater than a maximum thickness of the corresponding protruding part.

* * * * *